United States Patent
Fang et al.

[11] Patent Number: 6,077,760
[45] Date of Patent: Jun. 20, 2000

[54] STRUCTURE AND METHOD OF MANUFACTURING SINGLE-CRYSTAL SILICON CARBIDE/SINGLE-CRYSTAL SILICON HETEROJUNCTIONS WITH NEGATIVE DIFFERENTIAL RESISTANCE CHARACTERISTICS

[75] Inventors: Yean-Kuen Fang, Tainan; Kuen-Hsien Wu; Che-Ching Chen, both of Tainan Hsien, all of Taiwan

[73] Assignee: National Science Council, Taipei, Taiwan

[21] Appl. No.: 08/969,604

[22] Filed: Nov. 13, 1997

[30] Foreign Application Priority Data

Sep. 4, 1997 [TW] Taiwan .................................. 86112785

[51] Int. Cl.[7] .............................. H01L 21/20; H01L 29/86
[52] U.S. Cl. .............................. 438/492; 438/931; 257/6; 257/77
[58] Field of Search .................................. 148/DIG. 148; 257/6, 77; 438/57, 93, 492, 763, 931

[56] References Cited

U.S. PATENT DOCUMENTS 5,670,414  9/1997  Fang et al. .

Primary Examiner—Charles Bowers
Assistant Examiner—Keith Christianson
Attorney, Agent, or Firm—Ladas & Parry

[57] ABSTRACT

A method of manufacturing single-crystal silicon carbide/single-crystal silicon heterojunctions with negative differential resistance, by which one or more single-crystal silicon carbide/single-crystal silicon layer(s) with different types of dopants is/are formed on a silicon substrate, thereby forming new-type multiple negative differential resistance based on (a) single-crystal silicon carbide/single-crystal silicon heterojunction(s). The heterojunction(s) structure from top to bottom can be (1) Al/P—SiC/GCL/N—Si/Al; (2) Al/P—Si/GCL/P—SiC/GCL/N—Si/Al; and (3) Al/P—SiC/GCL/N—Si/GCL/P—SiC/GCL/N—Si/Al, wherein the GCL (Graded Reactant-gas Composition Ratio Layer) is a buffer layer formed between single-crystal silicon carbide layer and single-crystal silicon layer by gradually changing the composition of reaction gases. The structure and process of devices with negative differential resistance according to the invention are simpler than those of the prior art using Group III-V semiconductors. Furthermore, since a cheaper silicon substrate, and silicon carbide that can withstand high temperatures and radiation are used in this invention, manufacturing costs are greatly reduced.

24 Claims, 9 Drawing Sheets

STRUCTURE AND METHOD OF MANUFACTURING SINGLE-CRYSTAL SILICON CARBIDE/SINGLE-CRYSTAL SILICON HETEROJUNCTIONS WITH NEGATIVE DIFFERENTIAL RESISTANCE CHARACTERISTICS

BACKGROUND OF THE INVENTION

1. Field of the Invention

The invention relates to a semiconductor process, and in particular to a structure and method of manufacturing single-crystal silicon carbide/single-crystal silicon heterojunctions with negative differential resistance characteristics.

2. Description of Related Art

Since tunnel diode and Gunn diode were developed, negative differential resistance occurring at a P-N junction and in bulk semiconductors has widely drawn attention. Structures with N-type and S-type negative differential resistance (NDR) have been applied to manufacture high-speed switches, high-frequency oscillators or A/D converters. In addition, with their potential of being able to greatly reduce the complexities of multiple-value logic circuits, many NDRs are widely used to develop and manufacture memory cells and multi-stable switches. In the past, Group III-V negative differential resistance devices have been applied to research and develop high-speed switches, high-frequency oscillators or A/D converters, wherein a portion of devices having the characteristics of multiple negative differential resistance (MNR) can significantly reduce the complexities of multiple-valued logic circuits. Therefore, they can also be widely used for developing and manufacturing memory cells, A/D converters and multi-stable switches. Currently, most negative differential resistance devices are Group III-V semiconductor devices, such as resonant tunneling devices and double-heterojunction optical electrical switches. In addition, these devices can be used in advanced circuits, such as high-frequency oscillators and enhanced-logic circuits with photoelectric characteristics. However, since related processes are quite complicated, difficult and are not compatible with the processes of silicon integrated circuits, manufacturing costs are higher, and these devices can not work at temperatures over 200° C. Therefore, there are certain limitations for some special applications. Small portion of devices with negative differential resistance are manufactured with amorphous silicon. However, these devices have the disadvantages of low peak-to-valley current ratio (PVCR) and low reproducibility. Furthermore, they can not work at high temperatures.

SUMMARY OF THE INVENTION

In view of the above, the object of the invention is to provide a method for manufacturing a single-crystal silicon carbide/single-crystal heterojunction structure with negative differential resistance characteristics. In this method, one or more single-crystal silicon carbide/single-crystal silicon layer(s) with different types of dopants is/are formed on a substrate, thereby manufacturing new negative differential resistance devices based on the silicon carbide/silicon heterojunction structure.

In a method of manufacturing single-crystal silicon carbide/single-crystal silicon heterojunctions according to the invention, since a substrate is formed by silicon, the processes of the invention are compatible with those of silicon integrated circuits, resulting in a decrease of the manufacturing costs. Moreover, devices that use silicon carbide with a high energy gap as the primary material, which are suitable for high temperature and high radiation operation, have the following advantages:

(1) compared with those of the prior art, the structure and method of manufacturing negative differential resistance devices according to the invention are really simple; and (2) since a cheaper silicon substrate and silicon carbide that can withstand high temperatures and high radiation are adopted, the manufacturing costs are reduced.

BRIEF DESCRIPTION OF THE DRAWINGS

The present invention will become more fully understood from the detailed description given hereinbelow and the accompanying drawings, which are provided for the purpose of illustrating preferred embodiments only and should not be construed as limiting the scope of the present invention, and wherein.

DETAILED DESCRIPTION OF THE INVENTION

Embodiment 1

Figure 1A:
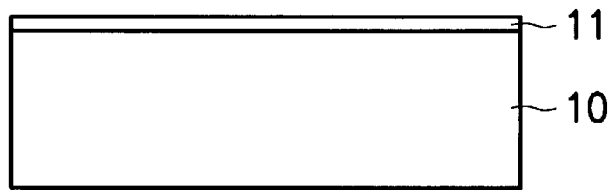
FIGS. 1A~1D are cross-sectional views illustrating a method for manufacturing single-crystal silicon carbide/single-crystal silicon heterojunctions with negative differential resistance according to a first embodiment of the invention.
Figure 1B:
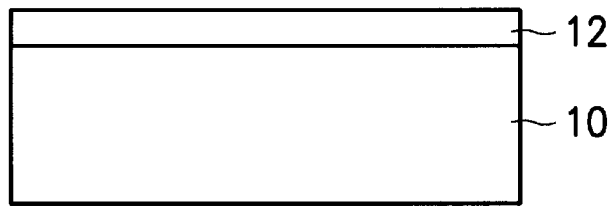
Figure 1C:
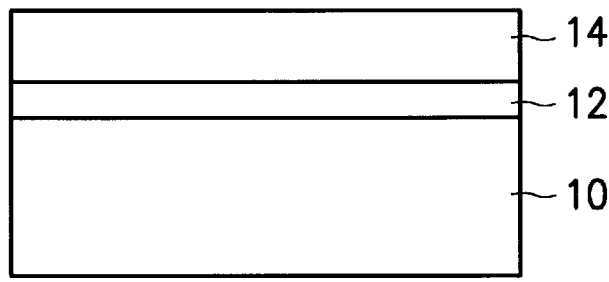

Referring to FIGS. 1A~1D, a method for manufacturing single-crystal silicon carbide/single-crystal silicon heterojunctions with negative differential resistance according to a first embodiment of the invention is illustrated. This method, suitable for an N-type silicon substrate 10, wherein a native oxide 11 has been already formed on the N-type silicon substrate 10 (shown in FIG. 1A), comprises the following steps:

(1) as shown in FIG. 1B, the N-type silicon substrate 10 is disposed into a growing system, the growing system is pumped until a pressure of $10^{-6}$ Torr is reached, and then the temperature is raised up to 900° C.; HCL (10 sccm) and $H_2$ (1.2 lpm) are input to the growing system with a pressure of 2.5 Torr for 10 minutes to remove the native oxide layer 11 on the N-type silicon substrate 10, and then the temperature is reduced down to room temperature and the growing system is pumped until a pressure of $10^{-6}$ Torr is reached; next, $SiH_4$ (12 sccm) and $H_2$ (1.2 lpm) are inputted to the growing system with a pressure of 2.5 Torr and a temperature of 1,200° C.; subsequently, $C_3H_8$ is input to the growing system with a flow rate gradually increasing from 0 to 10 sccm, thereby forming a graded reactant-gas composition ratio layer (GCL)12 with a thickness of 300~2,500 Å on the N-type substrate 10;

(2) as shown in FIG. 1C, $C_3H_8$ (10 sccm), $B_2H_6$ (12 sccm), $SiH_4$ (12 sccm) and $H_2$ (1.2 lpm) are input to the growing system with a pressure of 2.5 Torr and a temperature of 1,200° C. to form a P-type single-crystal silicon carbide (P—SiC) layer 14 with a thickness of 2500~5000 Å.

Figure 1D:
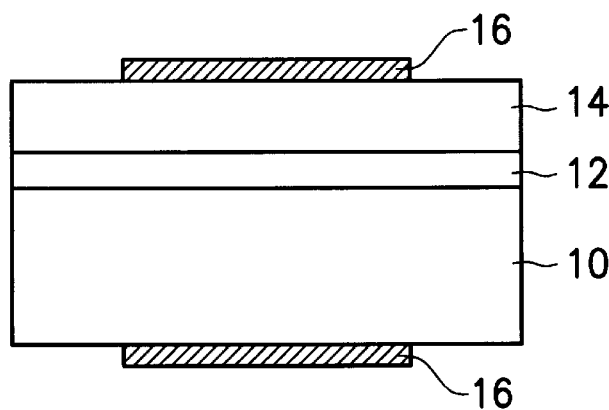

(6) as shown in FIG. 1D, Al layers 16 are formed on the both sides of devices by a vaporizing machine; and (7) finally, the areas of the devices are separated and defined by use of photolithography and plasma etching (not shown).

Figure 2:
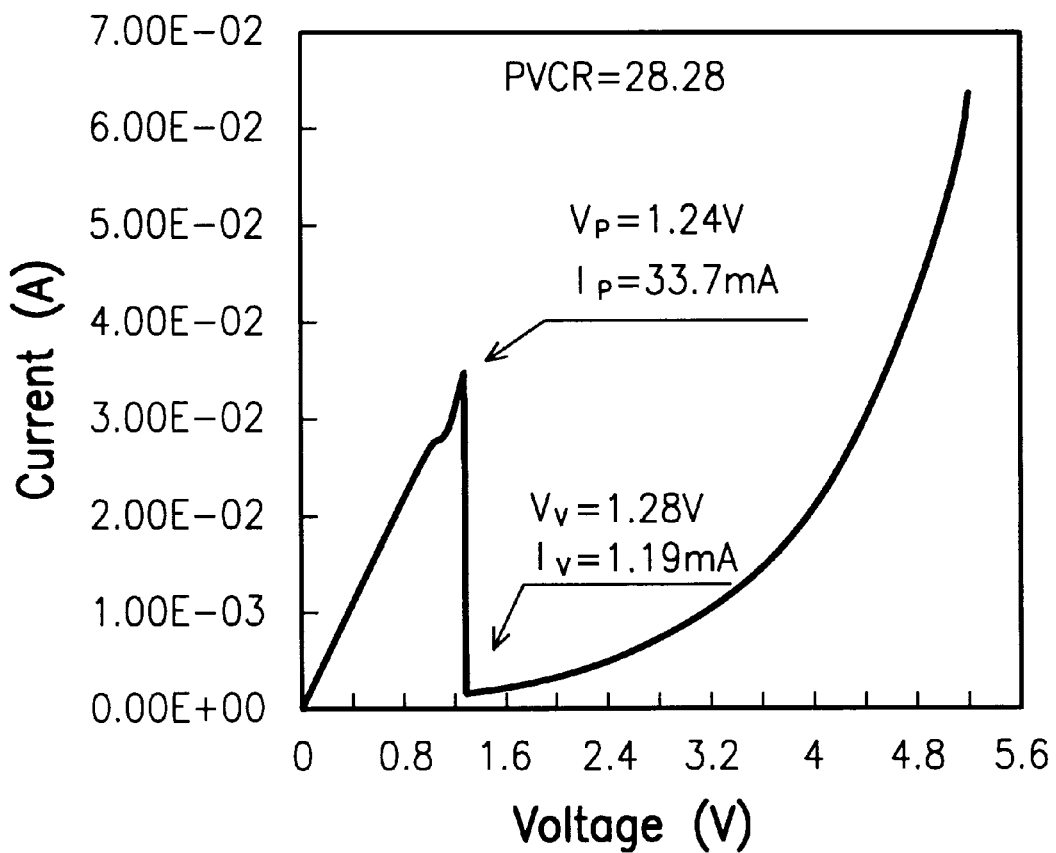
FIG. 2 is a current-voltage characteristic curve graph of a device having single-crystal silicon carbide/single-crystal silicon heterojunctions with negative differential resistance according to a first embodiment of the invention.

FIG. 2 is a current-voltage characteristic curve graph of a device having single-crystal silicon carbide/single-crystal silicon heterojunctions with negative differential resistance according to a first embodiment of the invention, wherein the peak voltage $V_P$=1.24V, peak current $I_P$=33.7 mA, valley voltage $V_V$=1.28V, valley current $I_V$=1.19 mA and peak-to-valley current ratio PVCR=28.28.

Embodiment 2

Figure 3A:
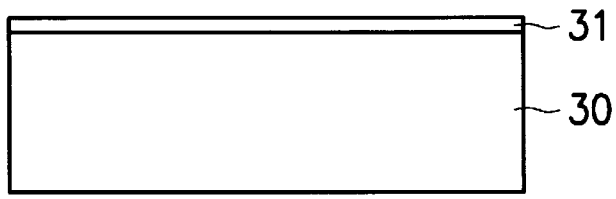
FIGS. 3A~3F are cross-sectional views illustrating a method for manufacturing single-crystal silicon carbide/single-crystal silicon heterojunctions with negative differential resistance according to a second embodiment of the invention.
Figure 3B:
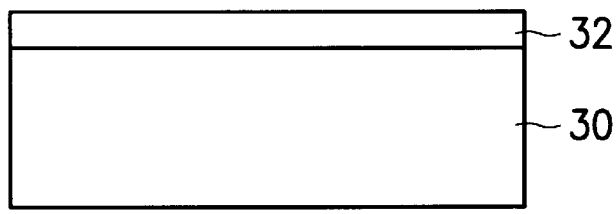
Figure 3C:
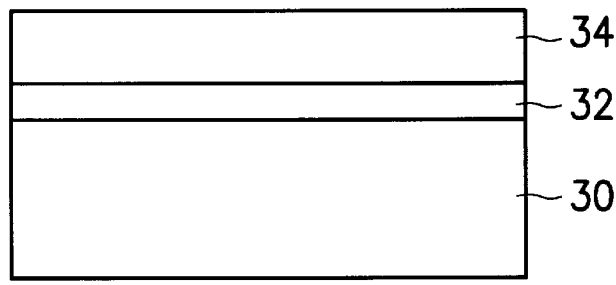
Figure 3D:
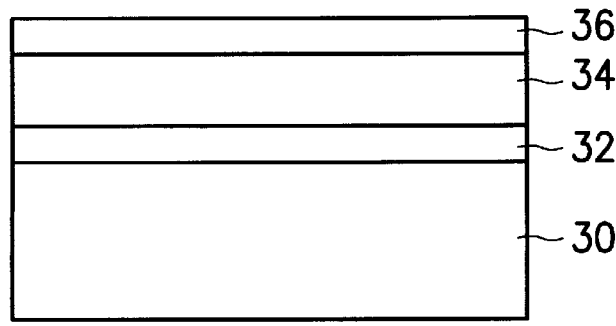
Figure 3E:
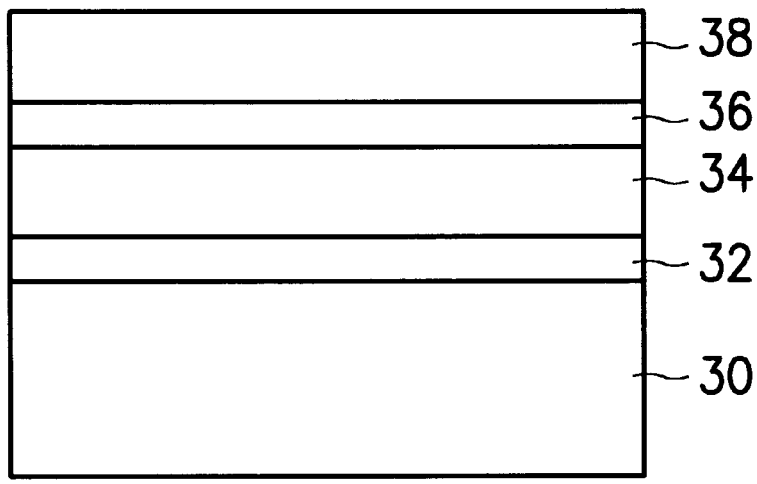
Figure 3F:
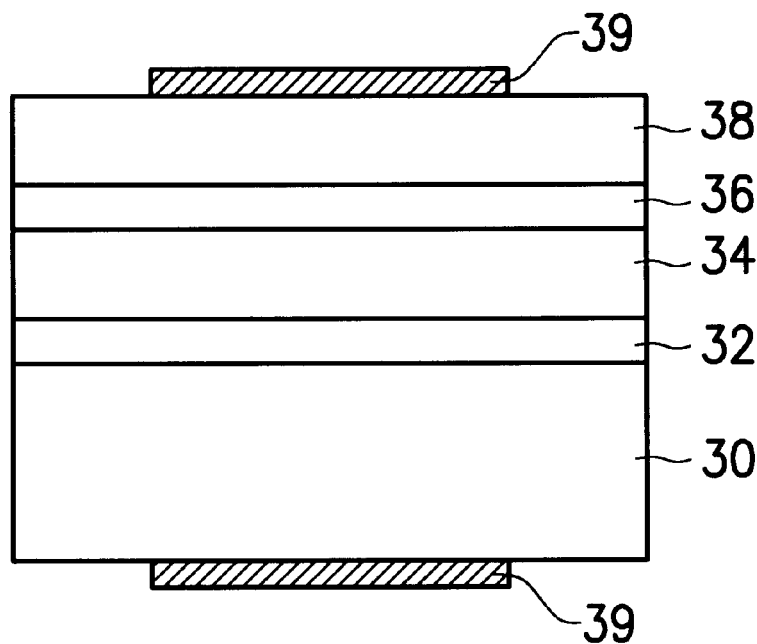

Referring to FIGS. 3A~3F, a method of manufacturing single-crystal silicon carbide/single-crystal silicon heterojunctions with negative differential resistance according to a second embodiment of the invention is shown. This method, suitable for an N-type silicon substrate 30, wherein a native oxide layer 31 is already formed on the N-type silicon substrate 30 (shown in FIG. 3A), comprises the following steps:

(1) referring to FIG. 3B, the N-type silicon substrate 30 is disposed into a growing system which is then pumped until vacuum with a pressure of $10^{-6}$ is reached and the temperature is raised to 900° C.; next, HCL (10 sccm) and $H_2$ (1.2 lpm) are input to the growing system with a pressure of 2.5 Torr for 10 mins. to remove the native oxide layer 31 on the N-type silicon substrate 30, and then the growing system is pumped until a pressure of $10^{-6}$ is reached and the temperature is reduced to room temperature; after that, $SiH_4$ (12 sccm) and $H_2$ (1.2 lpm) are input to the growing system with a pressure of 2.5 Torr and a temperature of 1,200° C.; subsequently, $C_3H_8$ with a flow rate gradually decreasing from 0 to 10 sccm is input to the growing system to form a first graded reactant-gas composition ratio layer (GCL) 32 with a thickness of 300~2,500 Å on the N-type silicon substrate 30;

(2) referring to FIG. 3C, $C_3H_8$ (10 sccm), $B_2H_6$ (12 sccm), $SiH_4$ (12 sccm) and $H_2$ (1.2 lpm) are input to the growing system with a pressure of 2.5 Torr and a temperature of 1,200° C. to form a P-type single-crystal silicon carbide (P—SiC) layer 34 with a thickness of 2500~5000 Å;

(3) referring to FIG. 3D, the flow rate of $C_3H_8$ gradually is decreased to 0 sccm, the temperature is rapidly reduced to 1,050° C., and the flow rate of $SiH_4$ gradually is decreased to 2.2 sccm to form a second graded reactant-gas composition ratio layer (GCL) 36 with a thickness of 300~2,500 Å on the P-type single-crystal silicon carbide (P—SiC) layer 34;

(4) referring to FIG. 3E, $SiH_4$ (2.2 sccm), $B_2H_6$ (2 sccm) and $H_2$ (1.2 lpm) are input to the growing system with a pressure of 2.5 Torr and a temperature of 1,050° C. to form a P-type single-crystal silicon (P—Si) layer 38 with a thickness of 2500~5000 Å on the second graded reactant-gas composition ratio layer (GCL) 36;

(5) referring to 3F, Al layers 39 are formed on both sides of the devices by a vaporizing machine; and (6) finally, the areas of the devices are separated and defined by use of photolithography and plasma etching.

Figure 4:
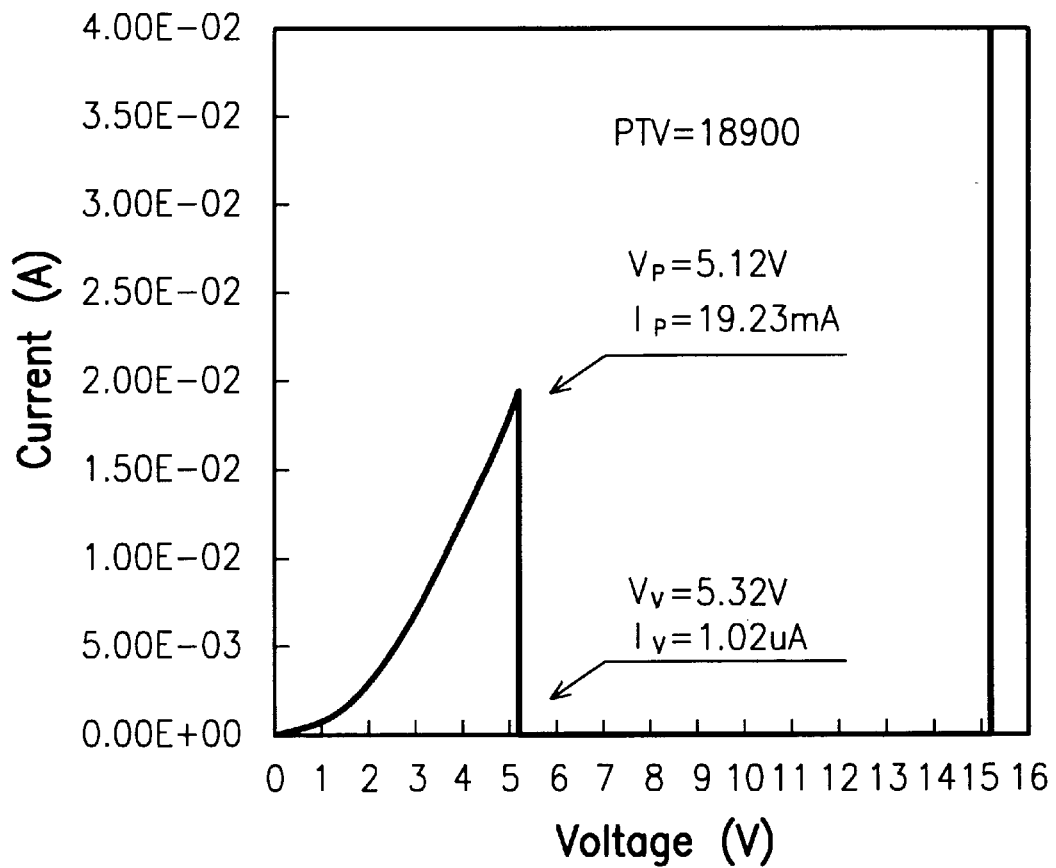
FIG. 4 is a current-voltage characteristic curve graph of a device having single-crystal silicon carbide/single-crystal silicon heterojunctions with negative differential resistance according to a second embodiment of the invention.

FIG. 4 is a current-voltage characteristic curve graph of a device having single-crystal silicon carbide/single-crystal silicon heterojunctions with negative differential resistance according to a second embodiment of the invention, wherein the peak voltage $V_P$=5.12V, peak current $I_P$=19.23 A, 91.35 mA, valley voltage $V_V$=5.32V, valley current $I_V$=1.02 μA and peak-to-valley current ratio PVCR=18722.7.

Embodiment 3

Figure 5A:
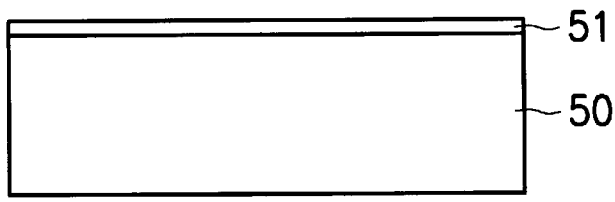
FIGS. 5A~5H are cross-sectional views illustrating a method for manufacturing single-crystal silicon carbide/single-crystal silicon heterojunctions with negative differential resistance according to a third embodiment of the invention.
Figure 5B:
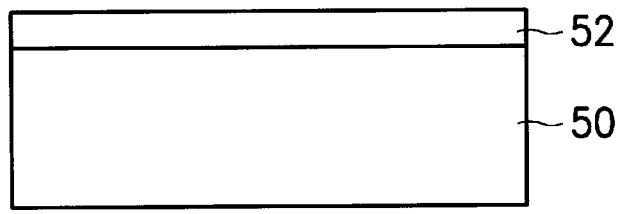
Figure 5C:
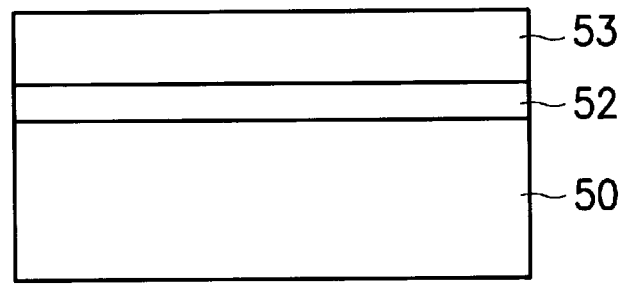
Figure 5D:
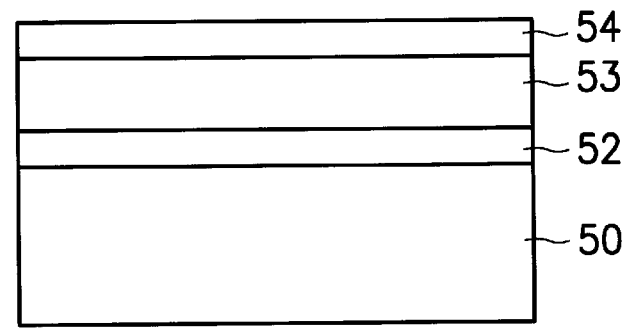
Figure 5E:
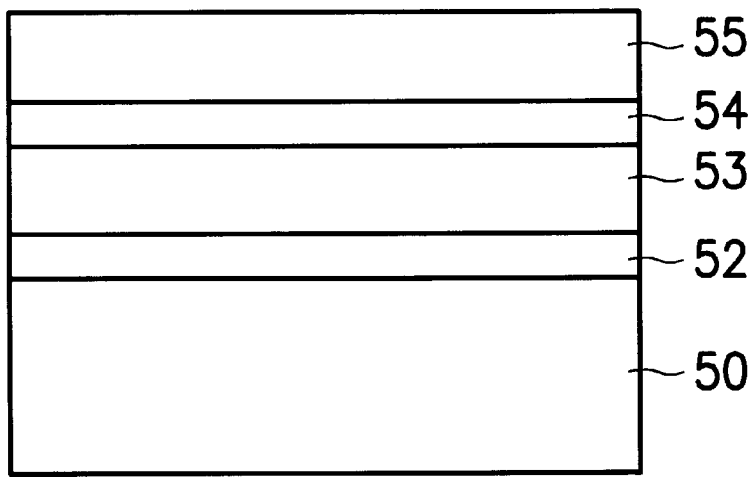
Figure 5F:
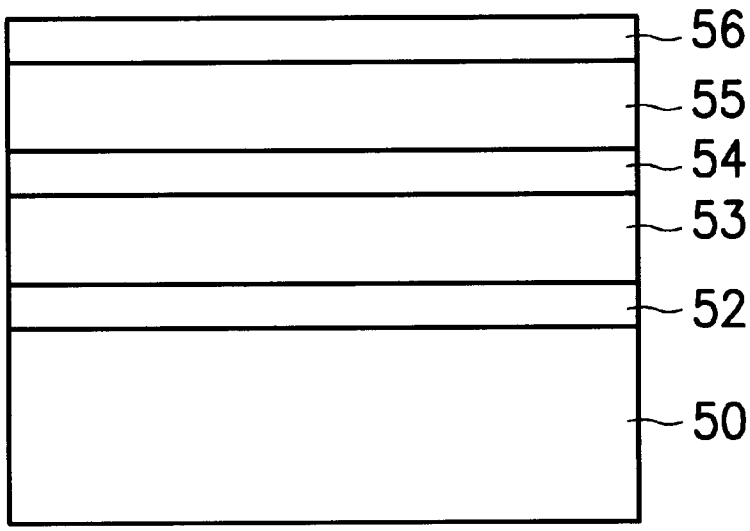
Figure 5G:
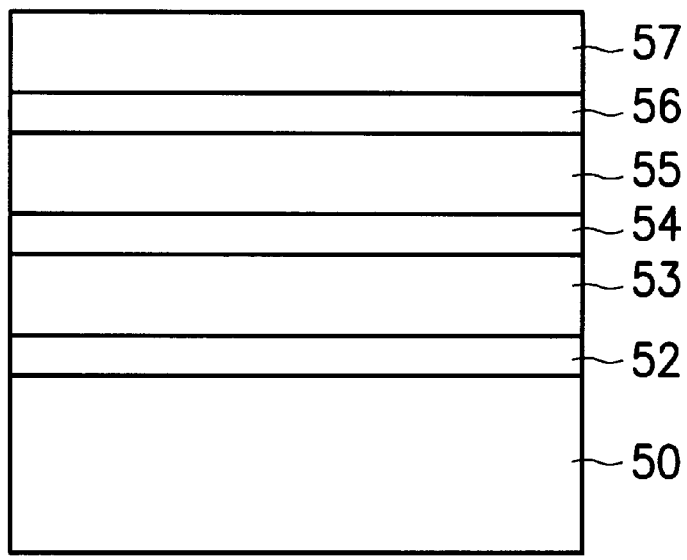
Figure 5H:
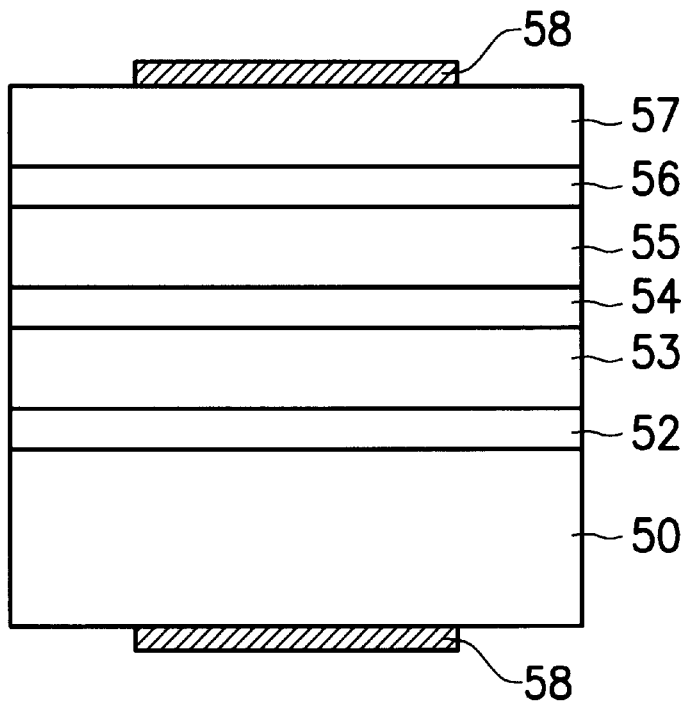

Referring to FIGS. 5A~5H, a method for manufacturing single-crystal silicon carbide/single-crystal silicon heterojunctions with negative differential resistance according to a third embodiment of the invention is illustrated. This method, suitable for an N-type silicon substrate 50, wherein a native oxide layer 51 is formed on the N-type silicon substrate 50, comprises the following steps:

(1) referring to FIG. 5B, an N-type silicon substrate is disposed into a growing system, wherein the growing system is pumped until vacuum with a pressure of $10^{-6}$ is reached, and the temperature is raised to 900° C.;

(2) HCL (10 sccm) and $H_2$ (1.2 lpm) are input to the growing system with a pressure of 2.5 Torr for 10 mins. to remove the native oxide layer 51 on the N-type silicon substrate 50, and then the temperature is reduced to room temperature and the growing system is pumped until a pressure of $10^{-6}$ is reached;

(3) $SiH_4$ (12 sccm) and $H_2$ (1.2 lpm) are input to the growing system with a pressure of 2.5 Torr and a temperature of 1,200° C., and then $C_3H_8$ with a flow rate gradually increased from 0 to 10 sccm is input to the growing system to form a first graded reactant-gas composition ratio layer (GCL) 52 with a thickness of 300~2,500 Å on the N-type silicon substrate 50;

(4) referring to FIG. 5C, $C_3H_8$ (10 sccm), $B_2H_6$ (12 sccm), $SiH_4$ (12 sccm) and $H_2$ (1.2 lpm) are input to the growing system with a pressure of 2.5 Torr and a temperature of 1,200° C. to form a first P-type single-crystal silicon carbide (P—SiC) layer 53 with a thickness of 2500~5000 Å on the first graded reactant-gas composition ratio layer (GCL) 52;

(5) referring to FIG. 5D, the flow rate of $C_3H_8$ gradually is decreased from 10 to 0 sccm, and the temperature is rapidly reduced to 1,050° C., and then the flow rate of $SiH_4$ is gradually decreased from 12 to 2.2 sccm to form a second graded reactant-gas composition ratio layer (GCL) 54 with a thickness of 300~2,500 Å on the first P-type single-crystal silicon carbide (SiC) layer 53;

(6) referring to FIG. 5E, $SiH_4$ (2.2 sccm), $PH_3$ (2 sccm) and $H_2$ (1.2 lpm) are input to the growing system with a pressure of 2.5 Torr and a temperature of 1,050° C. to form an N-type single-crystal silicon (N—Si) layer 55 on the second graded reactant-gas composition ratio layer (GCL) 54;

(7) referring to FIG. 5F, the flow rate of $SiH_4$ is rapidly raised from 2.2 to 12 sccm, the temperature is quickly increased to 1,200° C., and then the flow rate of $C_3H_8$ is gradually increased from 0 to 10 sccm to form a third graded reactant-gas composition ratio layer (GCL) 56 on the N-type single-crystal silicon layer 55;

(8) referring to FIG. 5G, $C_3H_8$ (10 sccm), $B_2H_6$ (12 sccm), $SiH_4$ (12 sccm) and $H_2$ (1.2 lmp) are input to the growing system with a pressure of 2.5 Torr and a temperature of 1,200° C. to form a second P-type single-crystal silicon carbide (P—SiC) layer 57 with a thickness of 2500~5000 Å on the third graded reactant-gas composition ratio layer (GCL) 56;

(8) Al layers 58 are formed on the both sides of devices by a vaporizing machine (not shown); and (9) finally, the areas of the devices are separated and defined by use of photolithography and plasma etching.

Figure 6:
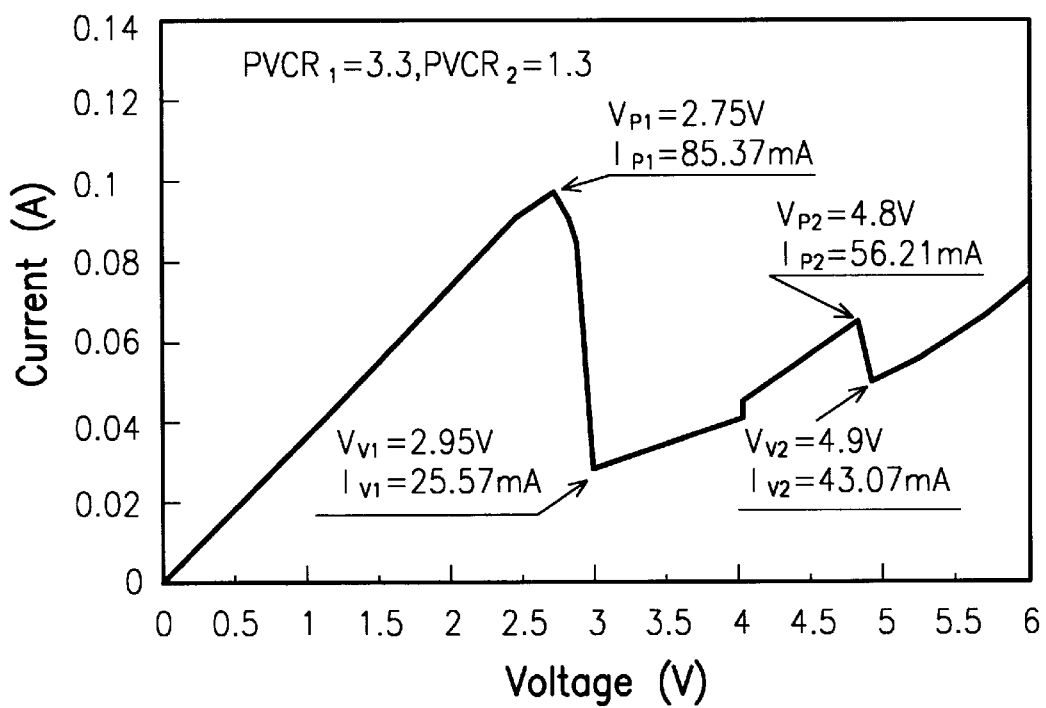
FIG. 6 is a current-voltage characteristic curve graph of a device having single-crystal silicon carbide/single-crystal silicon heterojunctions with negative differential resistance according to a third embodiment of the invention.

FIG. 6 is a current-voltage characteristic curve graph of a device having single-crystal silicon carbide/single-crystal silicon heterojunctions with negative differential resistance according to a third embodiment of the invention, wherein the peak voltage $V_{P1}$=2.75V, peak current $I_{P1}$=85.37 mA, peak voltage $V_{V1}$=2.95V, valley current $I_{V1}$=25.57 μA, peak-to-valley current ratio PVCR1=3.34, peak voltage $V_{P2}$=4.8V, peak current $I_{P2}$=56.21 mA, valley voltage $V_{V2}$=4.9V, valley current $I_{V2}$=43.07 mA, and peak-to-valley current ratio PVCR2=1.3.

A single-crystal silicon carbide/single-crystal silicon heterojunction structure with negative differential resistance according to the invention has the following advantages:

(1) the structure and process according to the invention are really simple, that is, just one or more single-crystal silicon carbide/single-crystal silicon layer(s) is/are formed on a silicon substrate to form a new-type negative differential resistance, thereby simplifying the conventional negative differential resistance process;

(2) since the structure according to the invention has multiple negative resistance (MNN) characteristics, the structure has high potential for application to multiple-valued logic circuits and multi-stable switches;

(3) since the peak current density of the negative differential resistance is greater, electronic switches with high current driving capability can be made by the negative differential resistance;

(4) since the major material of the negative differential resistance according to the invention is silicon carbide, it can work at a temperature of 400° C.;

(5) since the negative differential resistance can be formed by an approach with simple processes and low cost, manufacturing costs are reduced; and (6) since the substrate is made from silicon material and silicon-based materials are used to develop the negative differential resistance, the invention is compatible with the current VLSI technology to develop Application Specific ICs (ASICs) and can also be used to manufacture integrated photoelectric switches when combined with other materials (such as amorphous silicon material).

Although the invention has been disclosed in terms of a preferred embodiment, the disclosure is not intended to limit the invention. Those knowledgeable in the art can make modifications within the scope and spirit of the invention which is determined by the appended claims below.

What is claimed is:

1. A method of manufacturing single-crystal silicon carbide/single-crystal silicon heterojunctions with negative differential resistance, suitable for a first-type silicon substrate, wherein a native oxide layer is already formed on said first-type silicon substrate, comprising:

removing said native oxide layer;

forming a graded reactant-gas composition ratio layer on said first-type silicon substrate;

forming a second-type single-crystal silicon carbide layer on said graded reactant-gas composition ratio layer; and forming a first metal layer on said second-type silicon carbide layer and a second metal layer on said first-type silicon substrate.

2. A method as claimed as 1, wherein said first-type is N-type and said second-type is P-type.

3. A method as claimed as 1, wherein said first-type is P-type and said second-type is N-type.

4. A method as claimed in claim 1, wherein said graded reactant-gas composition ratio layer is formed by inputting $SiH_4$ with a flow rate of 12 sccm and $H_2$ with a flow rate of 1.2 lpm, maintaining the pressure at 2.5 Torr, raising the temperature to 1,200° C., and then inputting $C_3H_8$ with a flow rate gradually increased from 0 to 10 sccm.

5. A method of manufacturing single-crystal silicon carbide/single-crystal silicon heterojunctions with negative differential resistance, suitable for a first-type silicon substrate, wherein a native oxide layer is formed on said first-type silicon substrate, comprising:

removing said native oxide layer;

forming a first graded reactant-gas composition ratio layer on said first-type silicon substrate;

forming a second-type single-crystal silicon carbide layer on said first graded reactant-gas composition ratio layer;

forming a second graded reactant-gas composition ratio layer on said second-type single-crystal silicon carbide layer;

forming a second-type single-crystal silicon layer on said second graded reactant-gas composition ratio layer; and forming a first metal layer on said second-type single-crystal silicon layer and a second metal layer on said first-type silicon substrate.

6. A method as claimed in claim 5, wherein said first-type is N-type and said second-type is P-type.

7. A method as claimed in claim 5, wherein said first-type is P-type and said second-type is N-type.

8. A method as claimed in claim 5, wherein said first graded reactant-gas composition ratio layer is formed by inputting $SiH_4$ with a flow rate of 12 sccm and $H_2$ with a flow rate of 1.2 lpm, maintaining the pressure at 2.5 Torr, raising the temperature to 1,200° C., and then inputting $C_3H_8$ with a flow rate gradually increased from 0 to 10 sccm.

9. A method as claimed in claim 8, wherein said second graded reactant-gas composition ratio layer is formed by inputting $C_3H_8$ with a flow rate gradually decreased to 0 sccm, rapidly reducing the temperature to 1,050° C., and then inputting $SiH_4$ with a flow rate gradually decreased to 2.2 sccm.

10. A method of manufacturing single-crystal silicon carbide/single-crystal silicon heterojunctions with negative differential resistance, suitable for a first-type silicon substrate, wherein a native oxide layer is already formed on said first-type silicon substrate, comprising:

removing said native oxide layer;

forming a first graded reactant-gas composition ratio layer on said first-type silicon substrate;

forming a first second-type single-crystal silicon carbide layer on said first graded reactant-gas composition ratio layer;

forming a second graded reactant-gas composition ratio layer on said first second-type single-crystal silicon carbide layer;

forming a first-type single-crystal silicon layer on said second graded reactant-gas composition ratio layer;

forming a third graded reactant-gas composition ratio layer on said first-type single-crystal silicon layer;

forming a second second-type single-crystal silicon carbide layer on said third graded reactant-gas composition ratio layer; and forming a first metal layer on said second second-type single-crystal silicon carbide layer and a second metal layer on said first-type silicon substrate.

11. A method as claimed in claim 10, wherein said first-type is N-type and second-type is P-type.

12. A method as claimed in claim 10, wherein said first-type is P-type and said second-type is N-type.

13. A method as claimed in claim 10, wherein said first graded reactant-gas composition ratio layer is formed by inputting $SiH_4$ with a flow rate of 12 sccm and $H_2$ with a flow rate of 1.2 lpm, maintaining the pressure at 2.5 Torr, raising the temperature to 1,200° C., and then inputting $C_3H_8$ with a flow rate gradually increased from 0 to 10 sccm.

14. A method as claimed in claim 13, wherein said second graded reactant-gas composition layer is formed by inputting $C_3H_8$ with a flow rate gradually decreased from 10 to 0 sccm, rapidly reducing the temperature to 1,050° C., and then inputting $SiH_4$ with a flow rate gradually decreased from 12 to 2.2 sccm.

15. A method as claimed in claim 14, wherein said third graded reactant-gas composition layer is formed by inputting $SiH_4$ with a flow rate rapidly increased from 2.2 to 12 sccm, raising the temperature to 1,200° C., and then inputting $C_3H_8$ with a flow rate gradually increased from 0 to 10 sccm.

16. A structure of manufacturing single-crystal silicon carbide/single-crystal silicon heterojunctions with negative differential resistance, suitable for a first-type silicon substrate, comprising:

a graded reactant-gas composition ratio layer formed on said first-type silicon substrate;

a second-type single-crystal silicon carbide layer formed on said graded reactant-gas composition ratio layer; and a first metal layer formed on said second-type single-crystal silicon carbide layer and a second metal layer formed on said first-type silicon substrate.

17. A structure as claimed in claim 16, wherein said first-type is N-type and said second-type is P-type.

18. A structure as claimed in claim 16, wherein said first-type is P-type and said second-type is N-type.

19. A structure of manufacturing single-crystal silicon carbide/single-crystal silicon heterojunctions with negative differential resistance, suitable for a first-type silicon substrate, comprising:

a first graded reactant-gas composition ratio layer formed on said first-type silicon substrate;

a second-type single-crystal silicon carbide layer formed on said first graded reactant-gas composition ratio layer;

a second graded reactant-gas composition ratio layer formed on said second-type single-crystal silicon carbide layer;

a second-type single-crystal silicon layer formed on said second graded reactant-gas composition ratio layer; and a first metal layer formed on said second-type single-crystal silicon layer and a second metal layer formed on said first-type silicon substrate.

20. A structure as claimed in claim 19, wherein said first-type is N-type and said second-type is P-type.

21. A structure as claimed in claim 19, wherein said first-type is P-type and said second-type is N-type.

22. A structure of manufacturing single-crystal silicon carbide/single-crystal silicon heterojunctions with negative differential resistance, suitable for a first-type silicon substrate, comprising:

a first graded reactant-gas composition ratio layer formed on said first-type silicon substrate;

a first second-type single-crystal silicon carbide layer formed on said first graded reactant-gas composition ratio layer;

a second graded reactant-gas composition ratio layer formed on said first second-type single-crystal silicon carbide layer;

a first-type single-crystal silicon layer formed on said second graded reactant-gas composition ratio layer;

a third graded reactant-gas composition ratio layer formed on said first-type single-crystal silicon layer;

a second second-type single-crystal silicon carbide layer formed on said third graded reactant-gas composition ratio layer; and a first metal layer formed on said second second-type single-crystal silicon carbide layer and a second metal layer formed on said first-type silicon substrate.

23. A structure as claimed in claim 22, wherein said first-type is N-type and said second-type is P-type.

24. A structure as claimed in claim 22, wherein said first-type is P-type and said second-type is N-type.

* * * * *